(12) United States Patent
Neidengard et al.

(10) Patent No.: US 8,756,451 B2
(45) Date of Patent: Jun. 17, 2014

(54) FREQUENCY SYNTHESIS METHODS AND SYSTEMS

(75) Inventors: Mark L. Neidengard, Beaverton, OR (US); Nasser A. Kurd, Portland, OR (US); Robert J. Greiner, Beaverton, OR (US); Vaughn J. Grossnickle, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 313 days.

(21) Appl. No.: 13/251,220

(22) Filed: Oct. 1, 2011

(65) Prior Publication Data

US 2013/0086410 A1    Apr. 4, 2013

(51) Int. Cl.
*G06F 1/00*  (2006.01)
*H03L 7/06*  (2006.01)
*H03L 7/00*  (2006.01)

(52) U.S. Cl.
USPC .............................. 713/501; 327/156; 331/2

(58) Field of Classification Search
USPC .................. 713/501; 327/156; 331/2
See application file for complete search history.

(56) References Cited

U.S. PATENT DOCUMENTS

| | | | |
|---|---|---|---|
| 6,522,177 B1* | 2/2003 | Spampinato | 327/107 |
| 7,012,474 B2* | 3/2006 | Yen | 331/74 |
| 7,216,249 B2* | 5/2007 | Fujiwara et al. | 713/501 |
| 7,528,665 B2* | 5/2009 | Coppola et al. | 331/2 |
| 7,573,303 B1* | 8/2009 | Chi et al. | 327/105 |
| 8,086,197 B2* | 12/2011 | Doris et al. | 455/179.1 |
| 8,368,436 B1* | 2/2013 | Chu | 327/156 |
| 2011/0298506 A1* | 12/2011 | Salle et al. | 327/156 |
| 2012/0262238 A1* | 10/2012 | Dong et al. | 331/2 |
| 2013/0057325 A1* | 3/2013 | Dong et al. | 327/147 |

* cited by examiner

*Primary Examiner* — Paul R Myers
*Assistant Examiner* — Christopher A Daley
(74) *Attorney, Agent, or Firm* — Garrett IP, LLC (57) ABSTRACT

Multi-tier methods and systems to synthesize a reference frequency, and control one or more tiers in view of multiple prioritized criteria. A first tier of a frequency synthesizer may include a first phase locked loop (PLL), which may include an inductive-capacitive voltage-controlled oscillator (LC VCO). One or more subsequent tiers may each include a second PLL, which may include a self-biased (SB) VCO PLL or a digitally-controlled oscillator (DCO) PPL. A subsequent tier may be controllable with respect to multiple parameters. Parameters may be evaluated and selected based on multiple criteria, which may be prioritized. Parameters may be selected, for example, to minimize a frequency error equal relative to a permissible deviation from a desired frequency as a first priority, reduce jitter as a second priority, and minimize a frequency error relative to the desired frequency as a third priority.

17 Claims, 10 Drawing Sheets

FIG. 15

FREQUENCY SYNTHESIS METHODS AND SYSTEMS

BACKGROUND

A frequency synthesizer may include a phase locked loop (PLL) to derive one of a number of frequencies from a reference frequency, and may be defined in terms of frequency bandwidth, a number of selectable frequencies, spacing between the selectable frequencies, frequency drift, noise/jitter, circuit size, power consumption, and/or jitter.

Jitter may arise from noise, and may be exacerbated at higher operating environment frequencies. Specifically:

[T]he rising demand for high-speed I/O has created an increasingly noisy environment in which DLL's and PLL's must function. This noise, typically in the form of supply and substrate noise, tends to cause the output clocks of DLL's and PLL's to jitter from their ideal timing. With a shrinking tolerance for jitter in the decreasing period of the output clock, the design of low jitter DLL's and PLL's has become very challenging.

Achieving low jitter in PLL and DLL designs can be difficult due to a number of design tradeoffs. Consider a typical PLL which is based on a voltage controlled oscillator (VCO). The amount of input tracking jitter produced as a result of supply and substrate noise is directly related to how quickly the PLL can correct the output frequency. To reduce the jitter, the loop bandwidth should be set as high as possible. Unfortunately, the loop bandwidth is affected by many process technology factors and is constrained to be well below the lowest operating frequency for stability. These constraints can cause the PLL to have a narrow operating frequency range and poor jitter performance.

(J. Maneatis, *Low-Jitter Process Independent DLL and PLL Based on Self-Biased Techniques*, IEEE Journal of Solid-State Circuits, Vol. 31, No. 11, November 1996, page 1723, column 1, citations omitted).

A number of PLL designs have been developed, including inductive-capacitive voltage-controlled oscillator (LC-VCO) based PLLs, and self-biased voltage-controlled oscillator (SB-VCO) based PLLs. An LC-VCO PLL may be suitable to derive a fixed-frequency having relatively little noise or jitter, but may not be suitable to derive a tunable frequency. A SB-VCO PLL may be suitable to derive a tunable frequency, but the frequency may exhibit jitter due to input noise and/or self-generated noise.

BRIEF DESCRIPTION OF THE DRAWINGS/FIGURES

In the drawings, the leftmost digit(s) of a reference number identifies the drawing in which the reference number first appears.

DETAILED DESCRIPTION

Figure 1:
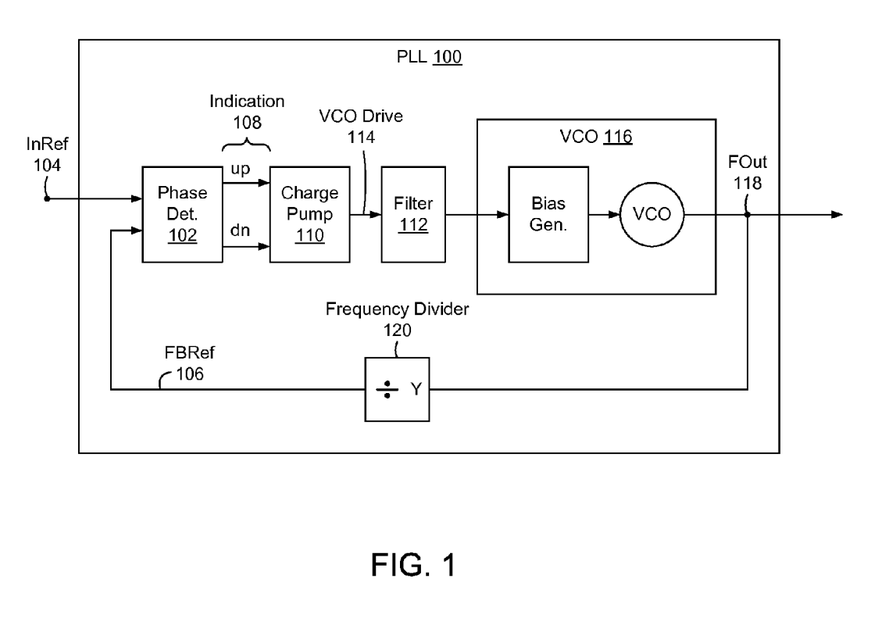
FIG. 1 is a block diagram of a phase-locked loop, including a voltage-controlled oscillator (VCO).

FIG. 1 is a block diagram of a PLL 100, including a voltage-controlled oscillator (VCO) 116 to output a frequency or clock FOut 118.

PLL 100 further includes a phase detector 102 to compare a phase of an input reference, InRef 104, with a phase of a feedback reference input FBRef 106, and output an indication 108 of a corresponding phase difference.

Phase detector 102 may include a digital phase detector, such as a phase comparator, to indicate whether the phase of InRef 104 leads or lags the phase of FBRef 106.

PLL 100 may include a charge pump 110 to convert indication 108 to a VCO drive 114 to control VCO 116 to increase or decrease frequency FOut 118.

PLL 100 may include a filter 112 to filter VCO drive 114. Filter 112 may be implemented to define and/or control loop dynamics of PLL 100 and/or integrate VCO 116 over time.

VCO 116 may be controlled to adjust frequency FOut 118 to align or lock the phases of InRef 104 and FBRef 106 with one another.

PLL 100 may include a feedback frequency divider 120 to divide the frequency of FOut 118 by a divider value Y, to control VCO 116 to generate FOut 118 with a frequency equal to the product of Y times the frequency of InRef 104.

PLL 100 may be implemented as part of a frequency synthesizer, to tune FOut 118 to one of multiple selectable frequencies. For example, frequency divider 120 may be configurable for multiple selectable values of Y. Alternatively, a synthesizer may include a configurable reference frequency divider to divide InRef 104 by one of multiple divider values.

For illustrative purposes, examples are described herein with reference to frequency dividers. Unless specified otherwise herein, a frequency multiplier may be used in place of and/or in addition to a frequency divider.

FIG. 1 is an example of a charge pump-driven VCO based PLL. PLL 100 is not, however, limited to a charge pump-driven VCO.

A PLL may include a digitally-controlled PLL, which may include a control finite state machine (FSM) to generate a digital control word, and a time-to-digital conversion circuit (TDC) to drive the FSM. The digital control word may be applied to a digital oscillator to provide a digital TDC-FSM-digitally-controlled-oscillator (DCO) system, which may be implemented to approximate control dynamics of an analog charge-pump-based PLL. Alternatively, the digital control word may be provided to a digital-to-analog converter (DAC), an output of which may be applied to a conventional VCO to provide a PLL.

Figure 2:
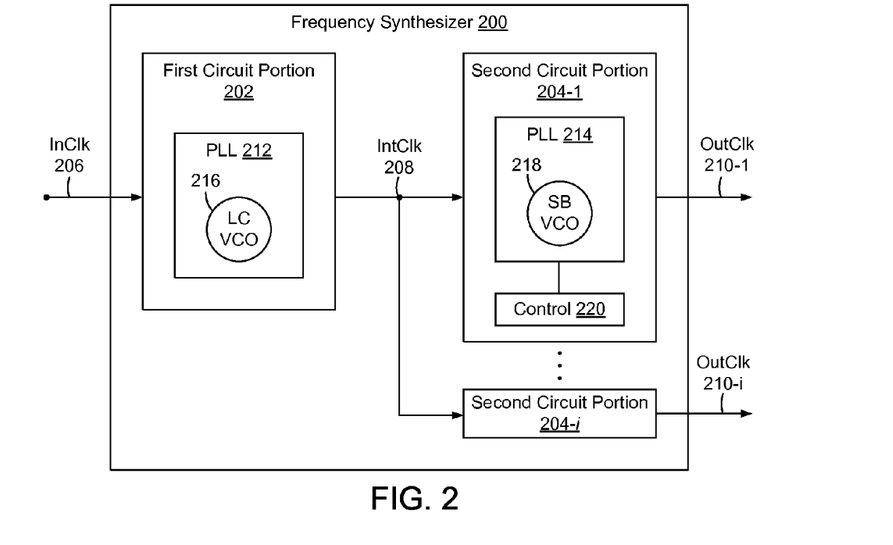
FIG. 2 is a block diagram of an n-tier frequency synthesizer, including a first tier circuit portion and a second tier circuit portion, wherein the first tier circuit portion includes a first phase-locked loop (PLL) to derive a fixed frequency interim frequency from an reference frequency, and the second circuit portion includes a configurable PLL to derive one of multiple selectable frequencies from the interim frequency.

FIG. 2 is a block diagram of an n-tier frequency synthesizer 200, including a first circuit portion 202, and one or more second circuit portions 204.

First circuit portion 202 may be implemented to derive a substantially fixed-frequency interim clock IntClk 208 from an input frequency or clock, InClk 206.

Each of the one or more second circuit portions 204 may be implemented to derive a corresponding output frequency or clock, OutClk 210, from IntClk 208. Each of the one or more second circuit portions 204 may be individually configurable to output the corresponding OutClk 210 at one of a number of selectable frequencies.

First circuit portion 204 may include a first phase locked loop (PLL) 212, and each of the one or more second circuit portions 204 may include a second PLL 214. For ease of explanation, the one or more second circuit portions 204 may be referred to herein in the singular, as a second circuit portion 204.

PLLs 212 and 214 may include corresponding oscillators 216 and 218, one or more of which may be controllable. Oscillator 216 and/or oscillator 218 may include a VCO or a DCO, such as described above.

For illustrative purposes, oscillator 216 is shown in FIGS. 2, 3, 7, 8, 9, and 11, as an inductive-capacitive VCO (LC-VCO), which may be useful to derive IntClk 208 with relatively little noise, and which may permit second circuit portion 204 to derive OutClk 210 with relatively little short-term jitter. Oscillator 216 is not, however, limited to an LC-VCO and may include, for example, another type of charge pump driven VCO and/or a DCO.

For illustrative purposes, oscillator 218 is shown in FIGS. 2-6, 10, and 11, as a self-biased VCO (SB-VCO). Oscillator 218 is not, however, limited to a SB-VCO and may include, for example, another type of charge pump-driven VCO and/or a DCO.

Synthesizer 200 may include a control portion 220 to select and/or apply parameter values to second circuit portion 204. Control portion 220 may be implemented to select parameter values to control the frequency and/or other characteristics of OutClk 210. Control portion 220 may implemented to select and/or optimize parameter values in view of multiple criteria, and may prioritized, such as described in examples below. Synthesizer 200 may include a control portion 220 for each of the one or more second circuit portions 204.

Second circuit portion 204, alone and/or in combination with first circuit portion 202, may be configurable to provide a relatively large number of selectable frequencies over a relatively wide bandwidth of OutClk 210, with relatively small frequency-spacing between the selectable frequencies of OutClk 210, for a relatively high degree of tuning precision.

First circuit portion 202 and second circuit portion 204 may be referred to herein as respective first and second tier circuit portions. Similarly, PLL 212 may be referred to herein as a first tier PLL, and PLL 214 may be referred to herein as a second tier PLL. In FIG. 2, frequency synthesizer 200 is illustrated as a two-tier system. A frequency synthesizer may include one or more additional tiers, referred to herein as an n-tier system, such as described below with reference to FIG. 3. Each additional tier may provide additional tuning precision to OutClk 210.

Figure 3:
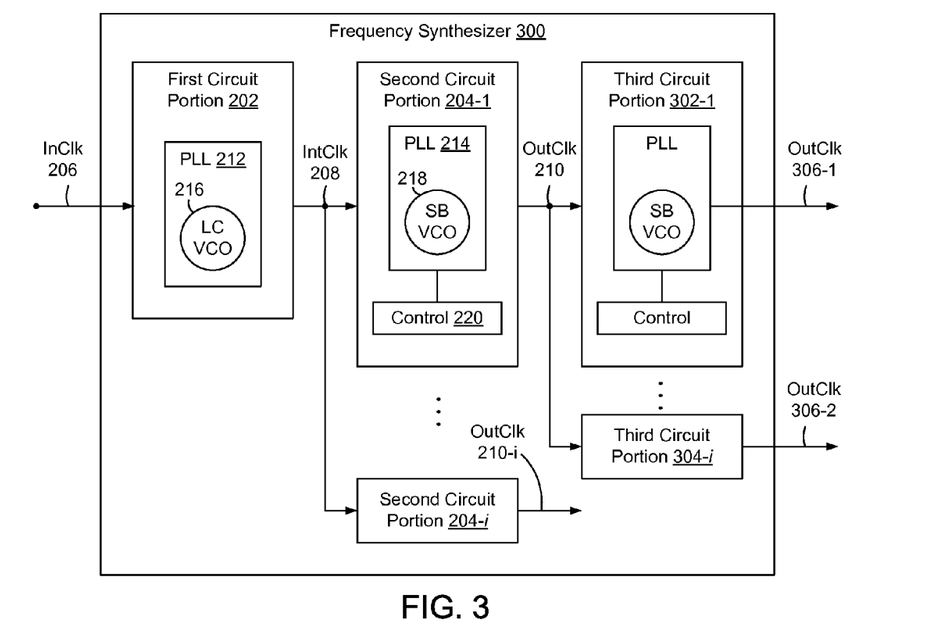
FIG. 3 is a block diagram of another n-tier frequency synthesizer, including first, second, and third tier circuit portions.

FIG. 3 is a block diagram of an n-tier frequency synthesizer 300, including first circuit portion 202, one or more second circuit portions 204 of FIG. 2, and one or more third circuit portions 302, each to derive a corresponding output clock, OutClk 306, from an OutClk 210. Each third circuit portion 302 may be similar to second circuit portion 204, and synthesizer 300 may include a control portion for each third circuit portion 302 to select and/or apply parameter values to the corresponding third circuit portion 302.

In an n-tier frequency synthesizer, each tier may add a corresponding numerator integer and denominator integer to a frequency ratio. In other words, each tier adds to a set of essentially prime numbers from which to derive a selectable frequency within a bandwidth, which may be defined by the frequency of IntClk 208. Stated another way, each additional tier may further reduce separation between selectable frequencies within the bandwidth. The number of tiers, n, may be selected to balance frequency richness, or tuning precision, with area and power consumption.

Figure 4:
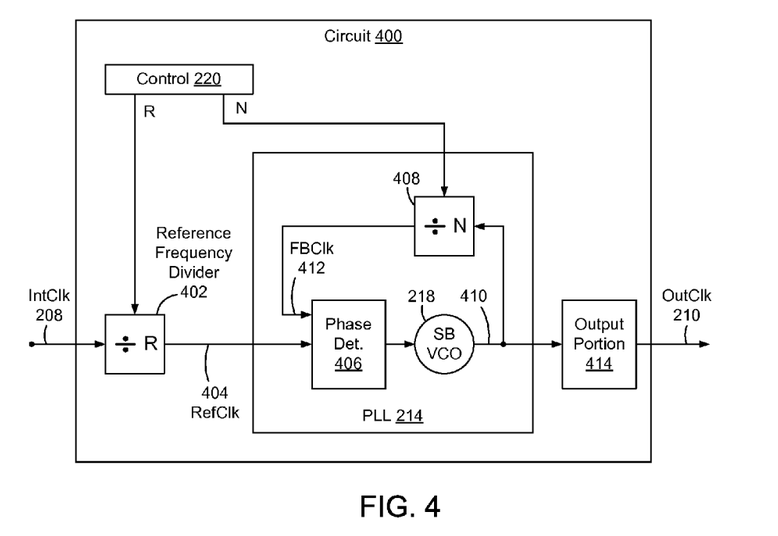
FIG. 4 is a block diagram of a circuit that may be implemented as a second and/or subsequent tier of an n-tier frequency synthesizer.

FIG. 4 is a block diagram of a circuit 400, which may be implemented as a second and/or subsequent tier of an n-tier frequency synthesizer.

Circuit 400 includes PLL 214 and control portion 220 of FIG. 2, and further includes a reference frequency divider 402 to frequency divide IntClk 208 by a divider value R, and to provide a corresponding RefClk 404 as a reference frequency to a phase detector 406 of PLL 214.

In FIG. 4, PLL 214 includes a feedback frequency divider 406 in a feedback path to frequency divide an output 410 of oscillator 218 by a divider value N, and to provide a corresponding feedback reference FBClk 412 to phase detector 406.

Reference frequency divider 402 and/or feedback frequency divider 406 may include an integer frequency divider, an even-integer frequency divider, an odd-integer frequency divider, or a fractional integer frequency divider, such as a half-integer frequency divider, and may be fixed or configurable.

Circuit 400 may include an output portion 414, which may include an output node to provide oscillator output 410 as OutClk 210. Alternatively, or additionally, output portion 414 may include circuitry to derive OutClk 210 from oscillator output 410, and/or from other frequencies, such as described in one or more examples below.

In FIG. 4, the frequency of oscillator output 410 may be defined by the product of (N/R) and the frequency of IntClk 208. Values of R and N may be selected from corresponding sets of pre-determined selectable values. A number of possible or permitted combinations of pre-determined values of R and N may define a number of selectable frequencies of oscillator output 410. Reference divider 402 and/or feedback divider 408 may be implemented as a half-integer frequency divider, such as to increase the number of selectable frequencies of oscillator output 410 within a given bandwidth. Methods and systems to select parameter values R and N are disclosed further below.

Where IntClk 208 has a relatively high-frequency, reference divider 402 may be controllable to derive RefClk 404 within a relatively wide frequency bandwidth. An upper limit of the bandwidth of RefClk 404 may correspond to the frequency of IntClk 208. The upper limit of the bandwidth of RefClk 404 may be reduced in view of characteristics of PLL 214. A lower limit of the bandwidth RefClk 404 may be set relatively low, or may be set to a higher frequency, which may help to reduce and/or manage long-term jitter of oscillator output 410, and frequencies derived therefrom. Jitter control is discussed further below. Upper and lower limits of the bandwidth of RefClk 404 may be defined and/or enforced with pre-determined minimum and maximum values of R.

A relatively high frequency IntClk 208, in combination with half-integer values of R and N, may provide an even richer set of selectable frequencies for OutClk 210, which may permit frequency synthesizer 400 to provide a frequency that more closely matches a desired frequency with relatively little jitter, as described further below.

Half-integer frequency dividers 402 and 408 may also permit doubling of RefClk 404 while maintaining oscillator output 410 constant, even where R or N is odd, which may reduce jitter and/or frequency drift of oscillator output 410.

In some situations, frequency error may be reduced and/or eliminated even where RefClk 404 is controlled to remain at or above a relatively high minimum frequency.

Figure 5:
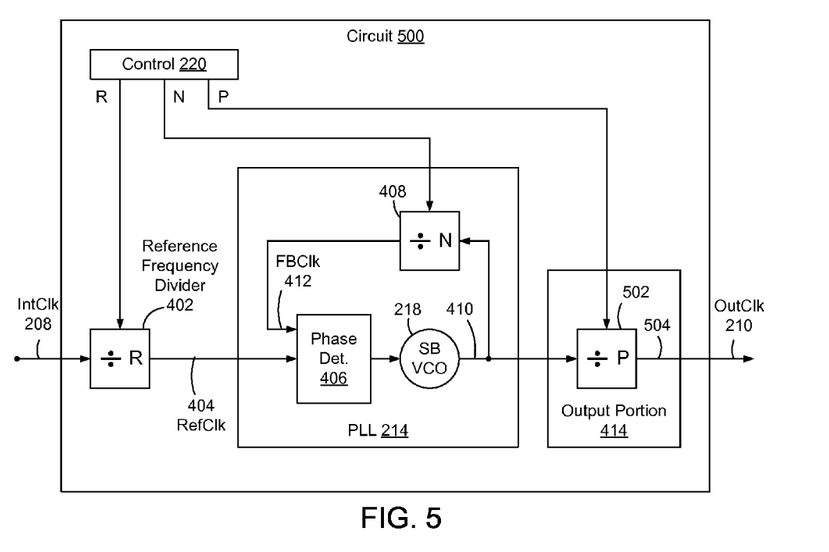
FIG. 5 is a block diagram of another circuit that may be implemented as a second and/or subsequent tier of an n-tier frequency synthesizer.

FIG. 5 is a block diagram of a circuit 500, which may be implemented as a second and/or subsequent tier of an n-tier frequency synthesizer.

Circuit 500 includes features described above with reference to FIG. 4, and further includes an output frequency divider 502 to frequency divide oscillator output 410 by a divider value P. In FIG. 5, an output 504 of frequency divider 502 has a frequency defined by the product of N/(R*P) and the frequency of IntClk 208.

Output 504 may be provided as OutClk 210, as illustrated in FIG. 5, or may be one of multiple selectable frequencies of OutClk 210, such as described below with reference to FIG. 10.

Output frequency divider 502 may include an integer frequency divider, an even-integer frequency divider, an odd-integer frequency divider, or a fractional integer frequency divider, such as a half-integer frequency divider, and may be fixed or configurable. Frequency divider 502 may be implemented as an even-frequency divider, such as to mitigate pattern jitter where a duty cycle of oscillator 218 is not equal to 50%.

Methods and systems to select parameter values R, N, and P are disclosed further below.

In FIG. 2, second circuit portion 204 may be implemented to output multiple frequencies or clocks, such as described below with reference to FIG. 6.

Figure 6:
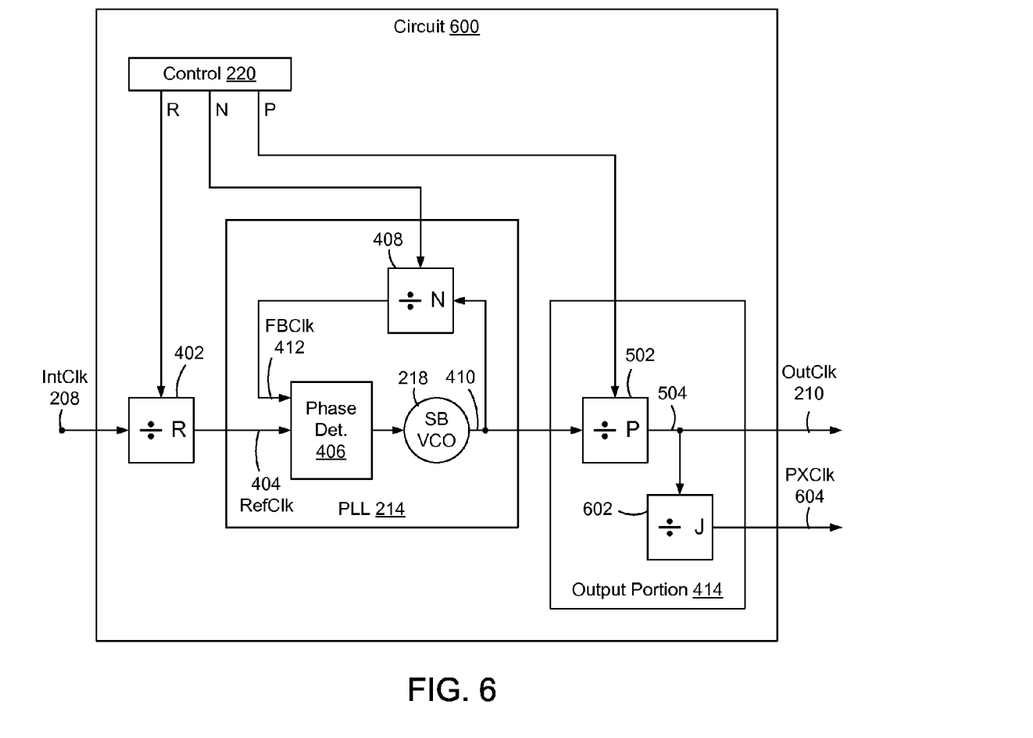
FIG. 6 is a block diagram of another circuit that may be implemented as a second and/or subsequent tier of an n-tier frequency synthesizer.

FIG. 6 is a block diagram of a circuit 600, which may be implemented as a second and/or subsequent tier of an n-tier frequency synthesizer.

Circuit 600 includes features described above with reference to FIG. 5, and further includes a second output frequency divider 602 to divide OutClk 210 by a divider value J, and output a corresponding clock PxClk 604. In the example of FIG. 6, a frequency of PxClk 604 is the product of N/(R*P*J) and the frequency of IntClk 208.

Output divider 602 may be useful, for example, to provide an additional frequency from frequency synthesizer 200.

Output frequency divider 602 may include an integer frequency divider, an even-integer frequency divider, an odd-integer frequency divider, or a fractional integer frequency divider, such as a half-integer frequency divider, and may be fixed or configurable.

In FIG. 2, InClk 206 may have one of multiple frequencies, and first circuit portion 202 may be configurable to provide IntClk 208 with the same relatively fixed-frequency for each potential frequency of InClk 206, such as described below with reference to FIG. 7.

Figure 7:
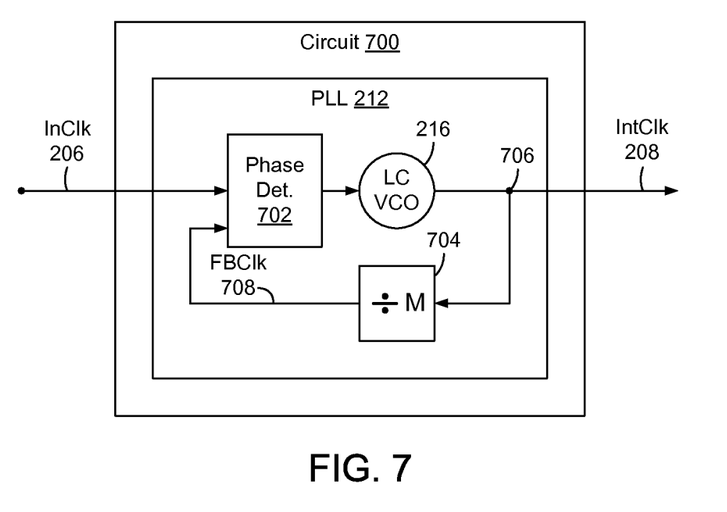
FIG. 7 is a block diagram of a circuit that may be implemented as a first tier of an n-tier frequency synthesizer.

FIG. 7 is a block diagram of a circuit 700, which may be implemented as a first tier of an n-tier frequency synthesizer.

Circuit 700 includes PLL 212 and oscillator 216 of FIG. 2, and further includes a phase detector 702, and a feedback frequency divider 704 in a feedback path to divide an output frequency 706 of oscillator 216 by a divider value M, and to provide a corresponding feedback clock FBClk 708 as a reference frequency to phase detector 702.

Feedback frequency divider 704 may include an integer frequency divider, an even-integer frequency divider, an odd-integer frequency divider, or a fractional integer frequency divider, such as a half-integer frequency divider, and may be fixed or configurable.

InClk 206 may have one of multiple frequencies, and feedback frequency divider 704 may be configurable to apply one of multiple selectable values of M, depending upon the frequency of InClk 206, to cause oscillator 216 to output IntClk 208 with the same relatively fixed-frequency for each potential frequency of InClk 206.

In FIG. 2, first circuit portion 202 may include a frequency divider to reduce a frequency output from oscillator 216, and output the reduced-frequency as IntClk 208, such as described below with reference to FIG. 8.

Figure 8:
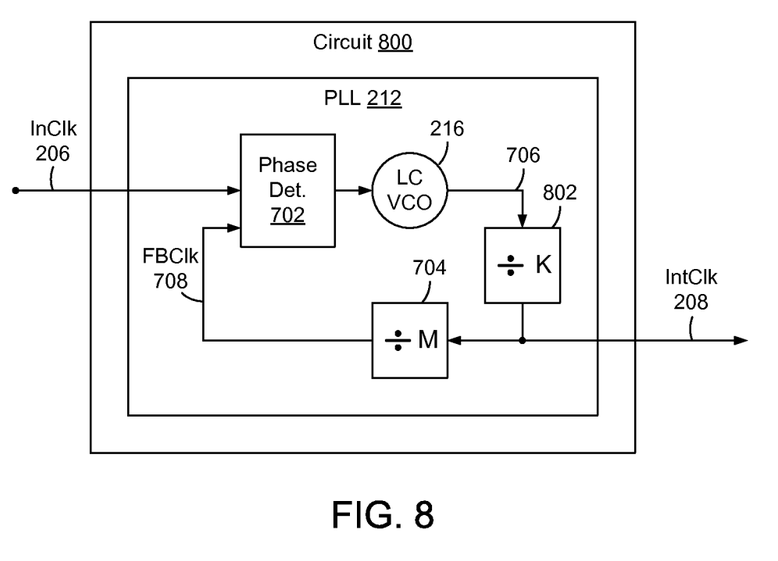
FIG. 8 is a block diagram of another circuit that may be implemented as a first tier of an n-tier frequency synthesizer.

FIG. 8 is a block diagram of a circuit 800, which may be implemented as a first tier of an n-tier frequency synthesizer.

Circuit 800 includes features described above with reference to FIG. 7, and further includes a second frequency divider 802 to divide oscillator output 706 by a divider value K. In this example, the frequency of IntClk 208 is defined by the frequency of oscillator output 706 divided by K, and the frequency of FBClk 708 is defined by the oscillator output 706 divided by (K*M). Second frequency divider 802 may be useful, for example, it is desired to provide oscillator output 706 at a higher-frequency that the frequency of IntClk 208, such as described below with respect to FIGS. 9 and 10.

Second frequency divider 802 may include an integer frequency divider, an even-integer frequency divider, an odd-integer frequency divider, or a fractional integer frequency divider, such as a half-integer frequency divider, and may be fixed or configurable.

A combination of a configurable first feedback frequency divider 704 and a fixed second frequency divider 802 may be useful, for example, to provide oscillator output 706 with a relatively high fixed frequency, and to provide IntClk 208 with a lower fixed for each potential frequency of InClk 206.

As an example, InClk 206 may have one of two frequencies, such as 120 MHz and 135 MHz, and circuit 800 may be implemented to provide oscillator output 706 at a fixed frequency of 8.1 GHz and IntClk 208 at a fixed frequency of 2.7 GHz.

Where K is be set to 3, for example, M may be set to one of 22.5 and 20, depending upon the frequency of InClk 206.

When InClk 206 has a frequency of 120 MHz and M is set to 22.5, oscillator output 706 has a frequency of (InClk 206)*K*M=(120 MHz)*3*22.5=8.1 GHz, and InClk 208 has a frequency of (InClk 206)/K=8.1 GHz/3=2.7 GHz.

When InClk 206 has a frequency of 135 MHz and M is set to 20, the frequency of oscillator output 706 remains at (InClk 206)*K*M=(135 MHz)*3*20=8.1 GHz, and the frequency of InClk 208 remains at (InClk 206)/K=8.1 GHz/3=2.7 GHz.

In FIG. 2, first circuit portion 202 may be implemented to provide multiple fixed-frequency clocks to second circuit portion 204, such as described below with reference to FIG. 9.

Multiple fixed frequency clocks may permit second circuit portion 204 to provide a greater number of selectable frequencies from which to generate OutClk 210, such as described below with reference to FIG. 10.

Figure 9:
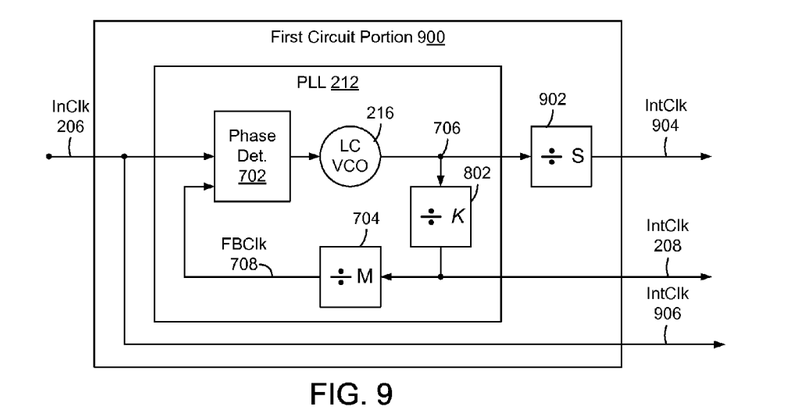
FIG. 9 is a block diagram of another circuit that may be implemented as a first tier of an n-tier frequency synthesizer.

FIG. 9 is a block diagram of circuit 900, which may be implemented as a first tier of an n-tier frequency synthesizer.

Circuit 900 includes features described above with reference to FIG. 8, and further includes an output frequency divider 902 to divide oscillator output 706 by a divider value S, and to provide a corresponding second interim frequency IntClk 904 to a second tier circuit. In the example of FIG. 9, IntClk 904 has a frequency of InClk 206 multiplied by (K*M)/S.

Output frequency divider 902 may include an integer frequency divider, an even-integer frequency divider, an odd-integer frequency divider, or a fractional integer frequency divider, such as a half-integer frequency divider, and may be fixed or configurable.

In the example of FIG. 9, circuit 900 is further implemented to provide InClk 206 as a third interim clock, IntClk 906, to a second tier circuit.

A second or subsequent tier circuit may include circuitry to selectively synthesize one of IntClk 208 and IntClk 904, and/or to selectively output one of a synthesized frequency and IntClk 906 as OutClk 201, such as described below with reference to FIG. 10.

Figure 10:
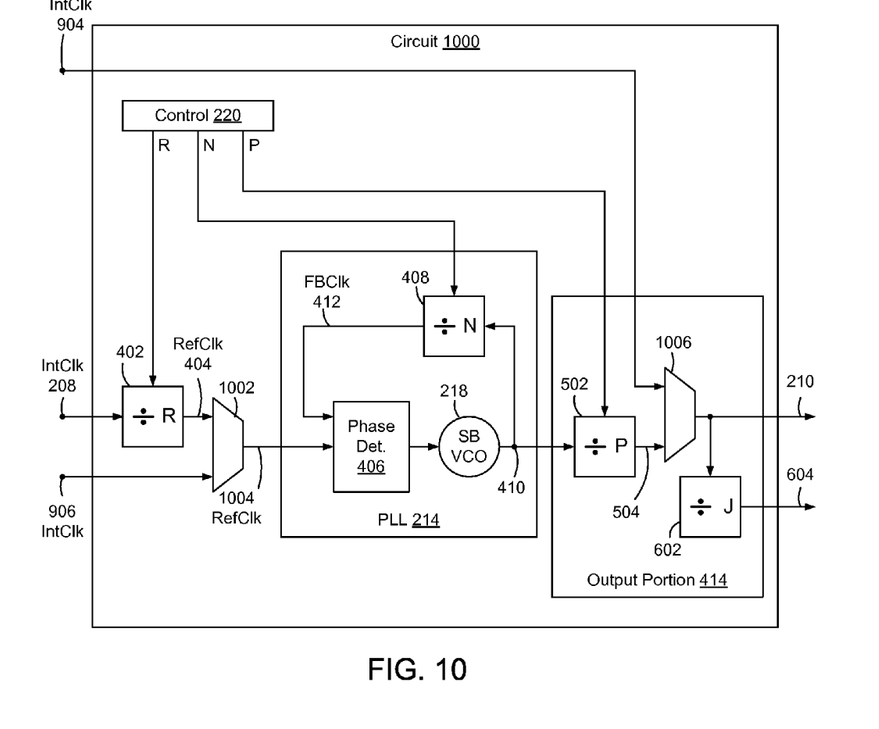
FIG. 10 is a block diagram of another circuit that may be implemented as a second and/or subsequent tier of an n-tier frequency synthesizer.

FIG. 10 is a block diagram of a circuit 1000 which may be implemented as a second and/or subsequent tier of an n-tier frequency synthesizer to receive multiple input reference frequencies.

Circuit 1000 includes features described above with reference to FIG. 6, and further includes an input multiplexer 1002 to selectively provide one of RefClk 404 and IntClk 906, as a reference input RefClk 1004 to phase detector 406.

In the example of FIG. 10, output portion 414 further includes an output multiplexer 1006 to selectively provide one of IntClk 904 and output 504 of frequency divider 502, as OutClk 210.

Input multiplexer 1002 and/or output multiplexer 1004 may further increase the richness of selectable frequencies available to OutClk 210, and/or increase the bandwidth of selectable frequencies available to OutClk 210, which may improve the ability to provide OutClk 210 at or near a desired frequency with relatively little jitter.

In FIG. 10, the frequency of OutClk 210 may be selectable from amongst the following frequencies:

(InClk 206)*((K*M)/S);

(InClk 206)*(K*M)*(N/(R*P)); and (InClk 206)*(N/P).

Figure 11:
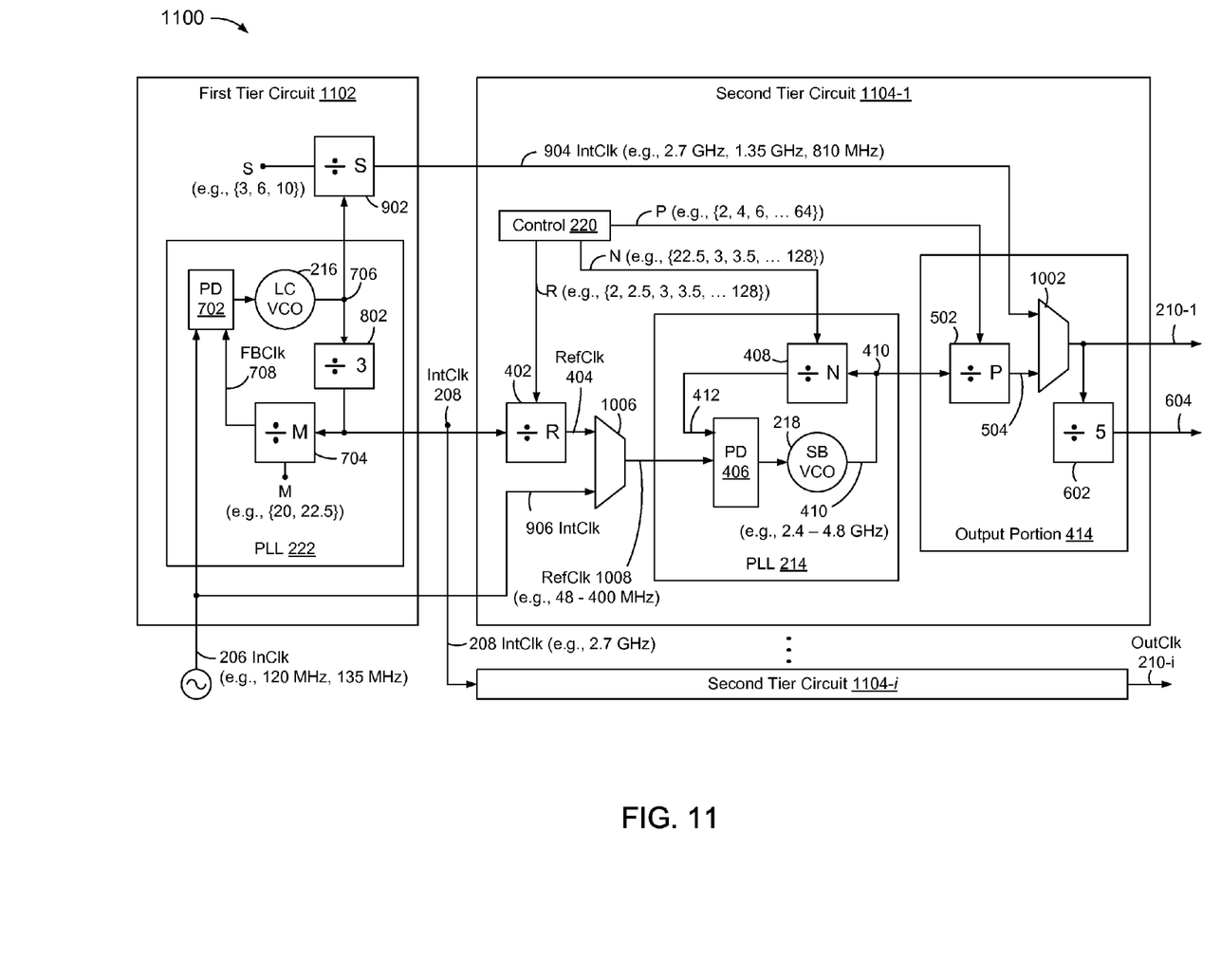
FIG. 11 is a block diagram of another n-tier frequency synthesizer, including example parameter values and frequencies.

FIG. 11 is a block diagram of an n-tier frequency synthesizer 1100, including a first tier circuit 1102 and one or more second and/or subsequent tier circuits, illustrated here as second tier circuits 1104.

First tier circuit 1102 and/or the one or more second tier circuits 1104 may include one or more features described above with reference to one or more of FIGS. 1 through 10.

FIG. 11 includes example parameter values and/or ranges of values for parameters S, K, M, R, N, P, and J, and example frequencies and/or frequency ranges for InClk 206, IntClk 208, IntClk 904, IntClk 906, and oscillator output 410. The example values are provided for illustrative purposes. Methods and systems disclosed herein are not limited to the examples herein.

Figure 12:
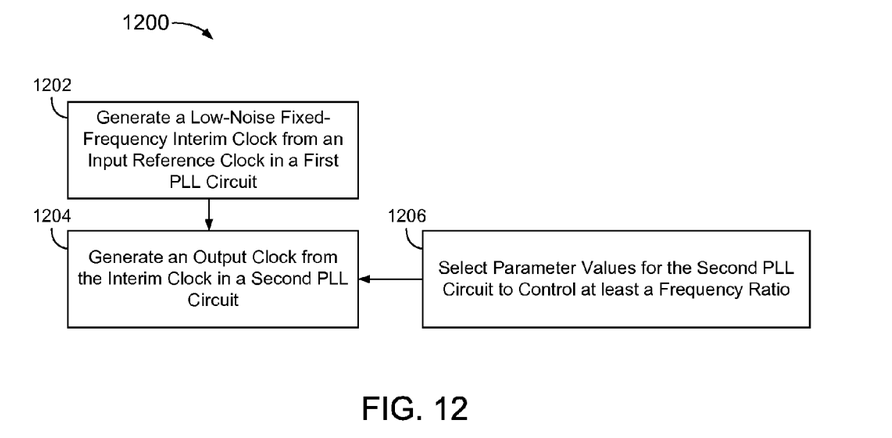
FIG. 12 is a flowchart of a method of performing n-tier frequency synthesis.

FIG. 12 is a flowchart of a method 1200 of performing n-tier frequency synthesis. Method 1200 may be implemented with one or more circuits disclosed herein. Method 1200 is not, however, limited to the example circuits disclosed herein.

At 1202, a relatively low-noise and substantially fixed-frequency, interim clock is generated from an input reference clock with a first PLL circuit, which may include, for example, an LC-VCO PLL.

At 1204, an output clock is generated from the interim clock with a configurable second PLL circuit, which may include a SB-VCO PLL or a DCO PLL.

At 1206, parameter values are selected for at least the configurable second PLL circuit to control at least a frequency of the output clock. The selecting at 1206 may include evaluating multiple combinations or sets of parameter values based on multiple criteria, which may include prioritized criteria.

Methods and system to select parameter values are described below. The methods and systems may be applied with respect to one or more parameters in one or more examples herein. The methods and system are not, however, limited to the examples herein.

Control portion 220 and/or other control system(s), (collectively referred to herein as "control portion 220"), may be implemented to select parameter values to generate OutClk 210 at, or near a desired, specified, and/or pre-determined frequency (hereinafter "desired frequency"). The desired frequency may correspond to a manufacturer-specified frequency. For example, OutClk 210 may be generated as a data transmit clock to re-time data for transmission from a first component to a second component. The first component may correspond to a computer system, and the second component may correspond to a monitor, for example, and the desired frequency of OutClk 210 may correspond to a data transmit rate associated with the monitor, which may vary by monitor type and/or manufacturer.

Figure 13:
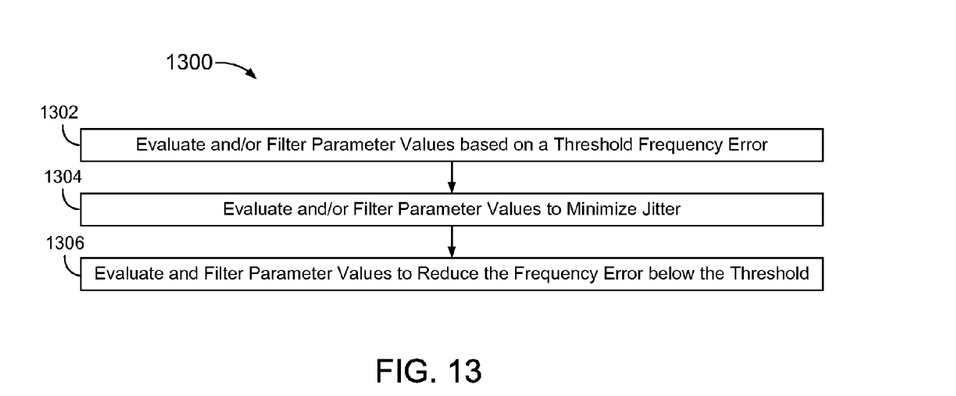
FIG. 13 is a flowchart of a method of evaluating parameter values to control an n-tier frequency synthesis process based on multiple, prioritized criteria.

FIG. 13 is a flowchart of a method 1300 of evaluating parameter values with respect to multiple priorities, to select parameter values to control an n-tier frequency synthesis process.

For illustrative purposes, method 1300 is described below with reference to control portion 220. Method 1300 is not, however, limited to control portion 220 or to example circuits disclosed herein.

At 1302, as a first priority, control portion 220 may evaluate and/or filter parameter values with respect to a threshold frequency error. The threshold frequency error may represent a permitted deviation from a desired frequency of OutClk 210. The threshold frequency error may correspond to an industry standard and/or a manufacturer specification.

The threshold frequency error may be quantified in terms of parts-per-million (PPM). As an example, a 16 MHz pre-determined frequency may have a permissible deviation, or deviation threshold of 1 PPM, or ±16 Hz of 16 MHz.

Control portion 220 may include multiple selectable deviation thresholds, which may be selected based on a component manufacturer-specified deviation tolerance.

Control portion 220 may determine a frequency error for each of multiple combinations of parameter values, and identify combinations for which the frequency error is at or below the threshold frequency error.

Where no combination of parameter values provides a frequency error at or below the threshold, a combination of parameter values for which frequency error is lowest may be selected. Where a single combination of parameter values provides a frequency error at or below the threshold, the single combination of parameters may be selected. Where multiple combinations of parameter values provide a frequency error at or below the threshold, processing proceeds to 1304.

At 1304, as a second priority, control portion 220 may evaluate and/or filter parameter values to reduce and/or minimize jitter of OutClk 210. Methods and system to reduce jitter are disclosed further below.

Where a single combination of parameter values provides the lowest level of jitter, the combination of parameter values may be selected. Where multiple combinations of parameter values provide equally low levels of jitter, processing proceeds to 1306.

At 1306, as a third priority, control portion 220 may evaluate and/or filter parameter values to reduce or eliminate the frequency error between OutClk 210 and the desired frequency.

In other words, in accordance with the first and second priorities, rather than selecting parameter values to minimize a frequency difference between OutClk 210 and the desired frequency, at the potential expense of jitter, control portion 220 may be implemented to reduce jitter to the extent possible while meeting a frequency error threshold. This may provide OutClk 210 with a frequency that is sufficiently suitable for an implementation, with less jitter than might be provided with a clock having less frequency error. This may provide better overall operation for the implementation. Moreover, in accordance with the third priority, where a set of parameter values exists that reduces jitter to the extent possible and reduces the frequency error below the threshold, the set of parameter values may be selected.

Jitter reduction is now described.

Jitter of OutClk 210, in one or more of FIGS. 2-6, 10, and 11, may result from noise on a reference frequency input to PLL 214, and/or noise generated within PLL 214.

Regarding input noise, PLL 212 may be implemented to output IntClk 208 with relatively little noise, such that IntClk 208 imparts relatively little if any noise to PLL 214. The relatively little noise may permit higher frequencies of RefClk 404, which may reduce long-term jitter, without significantly increasing input noise to PLL 214. PLL 212 may include, for example, a LC VCO, such as described further above.

Self-generated noise may arise within PLL 114 and/or oscillator 218 from random thermal fluctuations and/or shot noise. Where oscillator 218 is implemented as a SB VCO, such as described above, self-generated noise may be reduced or suppressed at higher self-bias current levels.

The self-bias current may be expressed as:

$$I_{SB} = F_{SB} * C, \quad (EQ. 1)$$

where,
$I_{SB}$ represents the self-bias current;
$F_{SB}$ represents an operating frequency of oscillator 218; and
C represents a capacitance seen by self-bias circuitry of oscillator 218.

In Eq. 1, the self-bias current is directly related to both the operating frequency of oscillator 218 and the capacitance seen by, or exposed to self-bias circuitry of oscillator 218. The self-bias current may thus be controlled by controlling the operating frequency of oscillator output 410 and/or by controlling the capacitance seen by the bias circuitry of oscillator 218.

The operating frequency may be controlled, at least in part, with parameter selection. For example, to maintain a relatively high operating frequency of oscillator 218, parameter values may be selected to maximize the product of the operating frequency of oscillator 218 and an input reference frequency of oscillator 218. A bus multiplier value may be used as an indirect measure of the operating frequency of oscillator 218. In the examples of FIGS. 4, 5, 6, 10 and 11, a bus multiplier of N/R may be used. In other words, parameter values may be selected to maximize the product of (RefClk 404)*(N/R).

Regarding the capacitance seen by self-bias circuitry of oscillator 218, for a given frequency of oscillator output 410, increasing the capacitance exposed to the self-bias circuitry forces oscillator 218 to increase the self-bias current to maintain the frequency.

Oscillator 218 may include a controllable capacitance, and control portion 220 may include a capacitive control portion to control the capacitance.

The capacitive control portion may be implemented to maintain the self-bias current of oscillator 218 relatively high and relatively constant, or within a relatively high range. The capacitive control portion may be implemented, for example, to increase the capacitance when the operating frequency of oscillator 218 falls to a threshold level. The capacitive control portion may be implemented to further increase the capacitance when the operating frequency of oscillator 218 falls to one or more additional threshold levels. The operating frequency of oscillator 218 may be indirectly compared to a threshold based on a bus multiplier value, such as described above.

The capacitive control portion may include one or more control bits to control the capacitance, and may be implemented to select one of multiple capacitive settings, which may include fuse-selectable settings. In the example of FIG. 11, frequency synthesizer 110 may employ a threshold for one bit of capacitor control, with four fuse-selectable settings, illustrated in FIG. 11 as 2.7 GHz, 3.0375 GHz, 3.375 GHz and 3.7125 GHz. The four settings may correspond to (N/R) thresholds of (8+T)/8, where T is selected from {0, 1, 2, and 3}. Such a threshold may be evaluated with binary arithmetic performed with respect to values of parameters R and N.

An n-tier frequency synthesizer as disclosed herein may be implemented in one or more of a variety of applications.

For example, computer systems and communication systems, and other systems, include components that interface or communicate with one another. For a particular type of component, a variety of device models may be available from one or more manufacturers. One or more of the device models may have interface timing specifications that differ from one or more other device models.

A computer system, for example, may include one or more connector ports to provide analog and/or digital display data to one or more monitors. Similarly, a monitor may include one or more connector ports to receive data from a computer system.

A connector port may correspond to one of a variety of types or interfaces, such as a video graphics array (VGA) interface, a high-definition multi-media interface (HDMI), or a digital visual interface (DVI). For such interfaces, a computer system may generate a data transmit clock to transmit data to a connected monitor. Timing specifications may differ, however, between different types of connector ports and/or amongst monitor models. For example, two monitors, each having an HDMI port, may have differ HDMI data transmit timing specifications.

A digital DisplayPort interface standard has been promulgated by the Video Electronics Standards Association (VESA), of Newark, Calif., to transmit video data packets and over a variable number of data pairs, with a clock embedded in the data signal. The DisplayPort interface is intended to replace DVI and VGA interfaces, but not HDMI interfaces. Moreover, many conventional monitors do not include a DisplayPort interface.

A frequency synthesizer as disclosed herein may be implemented to provide a relatively large number of selectable frequencies, over a relatively broad frequency spectrum and/or with a relatively fine degree of spacing between the selectable frequencies, to support timing specifications of a multiple device models and/or connector port types, examples of which are provided below with reference to FIGS. 14 and 15.

Figure 14:
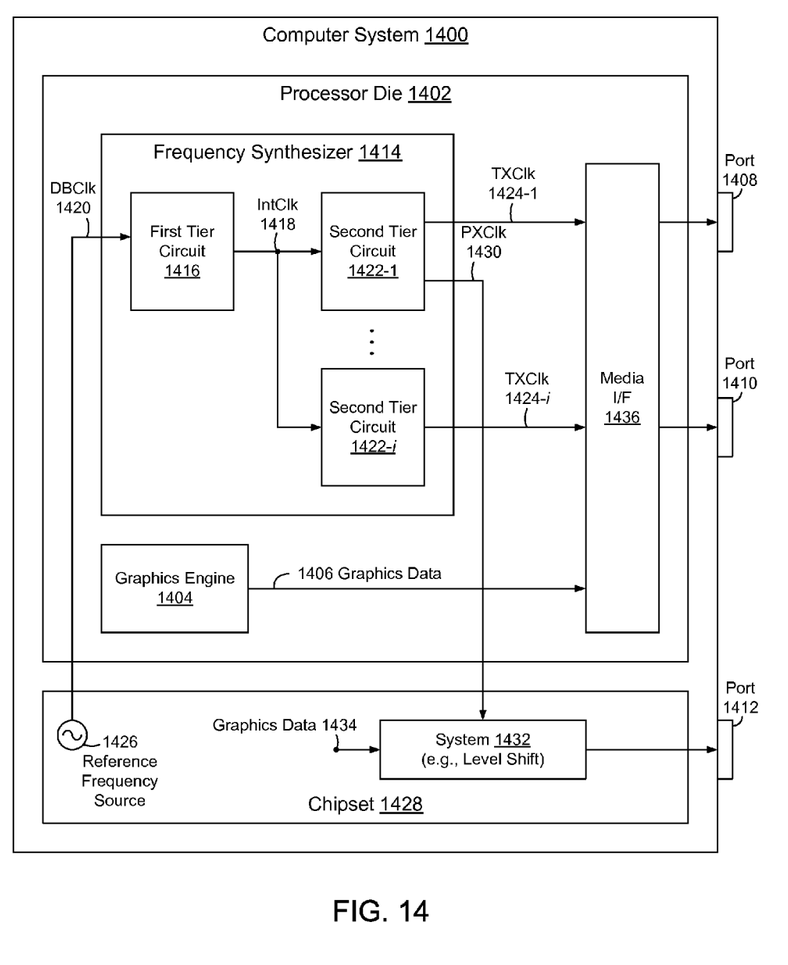
FIG. 14 is a block diagram of a computer system including an n-tier frequency synthesizer.

FIG. 14 is a block diagram of a computer system 1400, including a first integrated circuit (IC) die or chip, illustrated here as a processor die 1402, one or more additional IC dies, illustrated here as a chipset 1428, and one or more connector ports, illustrated here as connector ports 1408, 1410, and 1412.

Processor die 1402 may include one or more instruction processors and/or processor cores.

Processor die 1402 may further include a graphics engine 1404 to provide graphics or video data 1406 to one or more of connector ports 1408, 1410, and 1412.

One or more of connector ports 1408, 1410, and 1412 may correspond to an industry standard, and may include, for example, a VGA port, an HDMI port, and/or a DVI port. Computer system 1400 may further include a Display Port interface.

A monitor may include one or more connector ports to connect to one or more of connector ports 1408, 1410, and 1412.

Where computer system 1400 includes multiple connector ports, computer system 1400 may be implemented to provide data 1406 to a selected one of the connector ports, and/or to multiple connector ports concurrently.

As described above, different monitor models, from the same and/or different manufacturers, may have different data transfer timing specifications.

Computer system 1400 may include an n-tier frequency synthesizer 1414 to accommodate different data transfer timing specifications.

Frequency synthesizer 1414 may include a first tier circuit 1416 to generate an interim clock 1418 from an input reference frequency, illustrated here as a display bus clock DBClk 1420, such as described with reference to IntClk 208 and InClk 206, respectively, in one or more examples herein.

Frequency synthesizer 1414 may include one or more second tier circuits 1422, each to generate a corresponding data transmit clock TXClk 1424 from IntClk 1412, such as described with reference to OutClk 210 in one or more examples herein.

Frequency synthesizer 1414, and/or PLL's therein, may be referred to herein as a display frequency synthesizer and display PLLs, respectively.

Frequency synthesizer 1414 may include one or more subsequent-tier circuits to synthesize one or more data transmit clocks TXClk 1424, such as described above with reference to FIG. 3.

Processor die 1402 may further include a media interface 1436 to re-time data 1406 based on each of the one or more data transmit clocks TXClk 1424, and to provide corresponding re-timed data to one or more of connector ports 1408 and 1410.

In the example of FIG. 14, frequency synthesizer 1414 is illustrated as integrated within processor die 1402.

In FIG. 14, frequency synthesizer 1414 receives DBClk 1420 from an off-die source, illustrated here as a reference frequency source 1426 within chipset 1428. Reference frequency source 1426 may correspond to a centralized clock source for a plurality of electrical busses, ICs, devices, and/or other features of computer system 1400.

Processor die 1402 may be implemented with one of multiple chipsets 1428, each having a corresponding reference frequency source 1426. One or more of the chipsets may provide DBClk 1420 at a frequency that differs from that of one or more of the other chipsets. First tier circuit 1416 may include a controllable feedback frequency divider to provide IntClk 208 at the same fixed-frequency for each of the possible chipsets, such as described above with reference to feedback divider 704 in one or more examples above.

One or more second tier circuits 1422 may derive a second output clock from the corresponding TXClk 1424, such as described above with reference to PXClk 604 in one or more examples above. In the example of FIG. 14, second tier circuit 1422-1 outputs a second output clock as a pixel clock PXClk 1430.

In FIG. 14, pixel clock PXClk 1430 is provided to a system 1432, which may represent an off-die video engine to process graphics or video data 1434 for a particular connector type or monitor type. Data 1434 may correspond to data 1406 and/or other data. System 1434 may be implemented, for example, to level-shift data 1434 to a voltage level appropriate for connector port 1412. Connector port 1412 may correspond to, for example, a VGA connector port and system 1432 may include a VGA display engine.

Deriving pixel clock PXClk 1430 from TXClk 1424-1, rather than from another clock, such as a processor or CPU based clock, may reduce power consumption and/or real estate. For example, during a system-wide reduced-power consumption state, PLLs associated with TXClks 1424 and PXClk 1430, and associated circuitry, may be maintained in an operational state to support screen refresh operations, while PLLs, supporting logic, and/or clock distribution circuitry associated with other clocks may be placed in the reduced power-consumption state. Conversely, where a pixel clock is generated from another clock, such as a processor or CPU based clock, additional PLLs, supporting logic, and/or clock distribution circuitry may need to be maintained in operational states for screen refresh operations.

Figure 15:
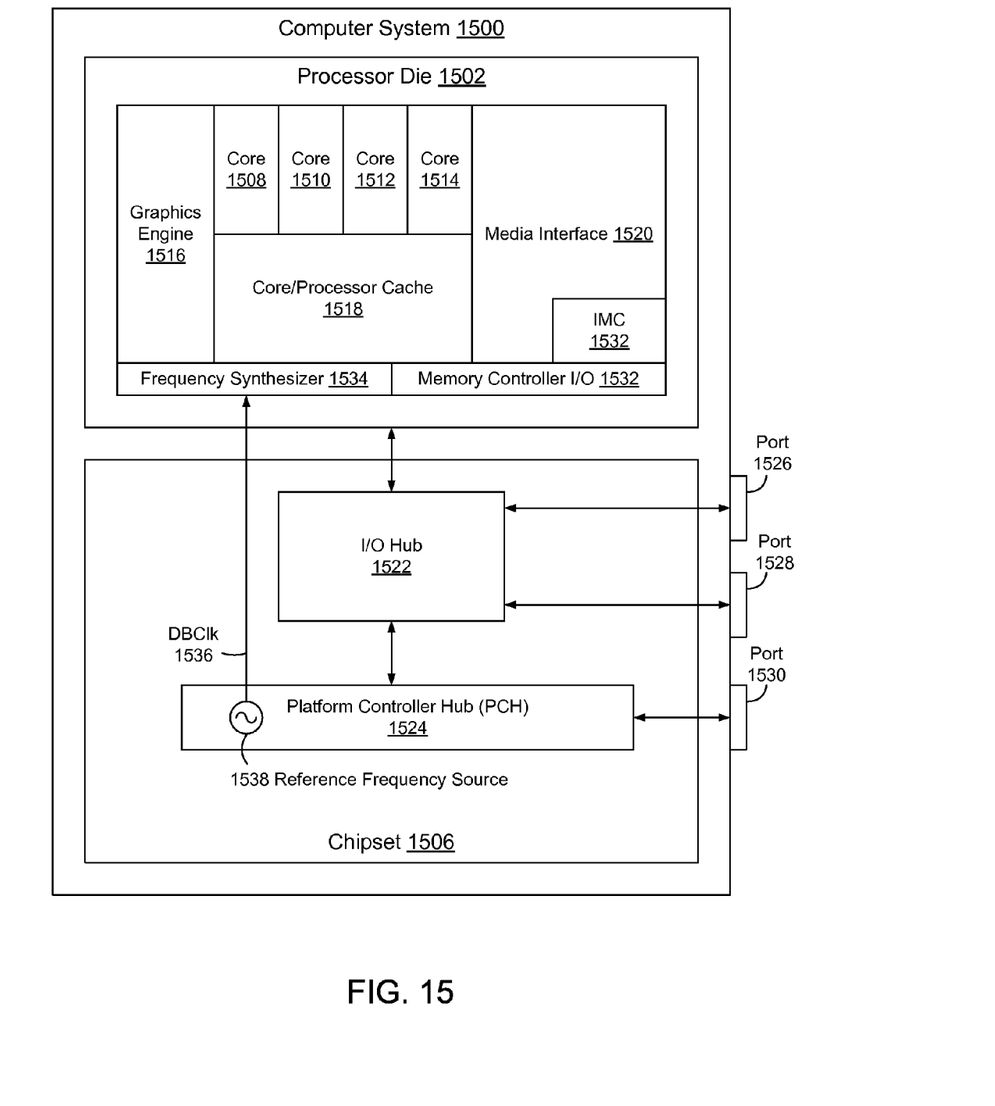
FIG. 15 is a block diagram of another computer system including an n-tier frequency synthesizer.

FIG. 15 is a block diagram of a computer system 1500, including a processor die 1502 and a supporting chipset 1506.

Processor die 1502 may include one or more processor cores, illustrated here as processor cores 1508, 1510, 1512, and 1514, and may include an integrated graphics engine 1516.

Processor die 1502 may include cache 1518, which may be shared amongst the one or more processor cores 1508, 1510, 1512, and 1514 and graphics engine 1516.

Processor die 1502 may include a media interface 1520 to communicate between cores 1502-1508 and other devices, such as memory, PCI Express devices, Direct Media Interface (DMI) devices, monitors, and/or a platform controller hub (PCH) 1524. Media interface 1520 may provide or support point-to-point communications.

Processor die 1502 may include a memory controller 1532, which may be integrated within media interface 1520.

Processor die 1502 and may include a memory controller input/output (I/O) 1532.

PCH 1524 may be provisioned as part of chipset 1506.

Chipset 1506 may include an input/output hub (IOH) 1522 to provide a connection point between various input/output (I/O) components and processor die 1502.

Computer system 1500 may include one or more connector ports, illustrated here as connector ports 1526, 1528, and 1530, such as described above with reference to connector ports 1408, 1410, and 1412 in FIG. 14.

Processor die 1502 may include an n-tier frequency synthesizer 1534 to generate a data transmit clock for each of one or more monitors connected to corresponding ports 1526, 1528, and 1530, such as described above with respect to TXClks 1424 and/or PXClk 1430.

Frequency synthesizer 1534 may receive a display bus clock DBClk 1536 as a reference frequency, which may be sourced by an off-chip reference frequency source 1538, which may reside within PCH 1524, such as described above with reference to FIG. 14.

One or more features disclosed herein may be implemented in hardware, software, firmware, and combinations thereof, including discrete and integrated circuit components, application-specific integrated circuits (ASICs), and may be implemented as part of a domain-specific integrated circuit package, and/or a combination of integrated circuit packages.

For example, and without limitation, first and second circuit portions 202 and 204 may be implemented in circuitry, and control portion 220, or portions thereof, may be implemented in circuitry, software, and/or combinations thereof. Software may be implemented as a computer program product including a computer readable medium having computer program logic stored therein to cause a processor to perform one or more functions in response thereto.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example provided herein.

What is claimed is:

1. A system, comprising:
   a first circuit portion, including a first phase locked loop (PLL), to generate a substantially fixed-frequency first interim clock from an input reference clock; and
   a second circuit portion, including a second PLL, to generate a first output clock from the first interim clock, wherein the second circuit portion is configurable with respect to multiple parameters to generate the first output clock at one of multiple selectable frequencies; and
   a control portion to select parameter values to apply to the second circuit portion, including to,
      identify parameter values for which a frequency difference between the first output clock and a desired frequency is equal to or less than a threshold value, as a first priority,
      identify parameter values for which first output clock jitter is lowest, as a second priority, and
      identify parameter values for which the frequency difference between the first output clock and the desired frequency is lowest, as a third priority.

2. The system of claim 1 wherein:
   the second circuit portion is configurable at least with respect to parameters N, R, and P;
   a frequency of the first output clock is a function of a product of the frequency of the first interim clock and $N/(R*P)$; and
   the control portion is configured to select from amongst integer and half integer values of N and R.

3. The system of claim 2, wherein:
   the control portion is further configured to select from amongst even integer values of P.

4. The system of claim 1, wherein:
   the first circuit portion is configured to output a second interim clock; and
   the second circuit portion is controllable to generate the first output clock from a selected one of the first and second interim clocks.

5. The system of claim 1, wherein:
   the input reference clock has one of multiple frequencies; and
   the first circuit portion is controllable to generate the first interim clock at the substantially fixed frequency for each of the multiple frequencies of the input reference clock.

6. The system of claim 1, wherein:
   the first PLL includes an inductive-capacitive voltage-controlled oscillator; and
   the second PLL includes one or more of a self-biased voltage-controlled oscillator and a digitally-controlled oscillator.

7. The system of claim 1, wherein:
   the second PLL includes a self-biased voltage-controlled oscillator (SB-VCO); and
   the control portion includes a capacitive control portion to increase a capacitance exposed to self-bias circuitry of the SB-VCO when an operating frequency of the SB-VCO is at or below a threshold.

8. A computer system, comprising:
   an integrated circuit (IC) die including one or more processors, a graphics engine, a media interface to re-time display data from the graphics engine based on a data transmit clock, and a frequency synthesizer to derive the data transmit clock from an off-die sourced display bus clock;
   wherein the frequency synthesizer includes,
   a first circuit portion, including a first phase locked loop (PLL) to generate a substantially fixed-frequency first interim clock from the display bus clock; and
   a second circuit portion, including a second PLL, to generate the data transmit clock from the first interim clock, wherein the second circuit portion is configurable with respect to multiple parameters to generate the first output clock at one of multiple selectable frequencies;
   wherein the second circuit portion is configurable at least with respect to parameters N, R, and P;
   wherein a frequency of the data transmit clock is a function of a product of the frequency of the first interim clock and $N/(R*P)$; and
   wherein the control portion is configured to select from amongst integer and half integer values of N and R and from even integer values of P.

9. The computer system of claim 8, wherein the IC die further includes a control portion to select parameters to apply to the second circuit portion, including to,
   identify parameter values for which a frequency difference between the data transmit clock and a desired frequency is equal to or less than a threshold value, as a first priority,
   identify parameter values for which data transmit clock jitter is lowest, as a second priority, and identify parameter values for which the frequency difference between the data transmit clock and the desired frequency is lowest, as a third priority.

10. The computer system of claim 8, wherein:
the first PLL includes an inductive-capacitive voltage-controlled oscillator; and
the second PLL includes one or more of a self-biased voltage-controlled oscillator and a digitally-controlled oscillator.

11. The computer system of claim 8, wherein:
the input reference clock has one of multiple frequencies; and
the first circuit portion is controllable to generate the first interim clock at the substantially fixed frequency for each of the multiple frequencies of the input reference clock.

12. A system, comprising:
a first circuit portion, including a first phase locked loop (PLL), to generate a substantially fixed-frequency first interim clock from an input reference clock; and
a second circuit portion, including a second PLL, to generate a first output clock from the first interim clock, wherein the second circuit portion is configurable with respect to multiple parameters to generate the first output clock at one of multiple selectable frequencies;
wherein the second circuit portion is configurable at least with respect to parameters N, R, and P;
wherein a frequency of the first output clock is a function of a product of the frequency of the first interim clock and N/(R*P); and
wherein the control portion is configured to select from amongst integer and half integer values of N and R, and amongst even integer values of P.

13. The system of claim 12, further including a control portion to select parameter values to apply to the second circuit portion, including to,
identify parameter values for which a frequency difference between the first output clock and a desired frequency is equal to or less than a threshold value, as a first priority,
identify parameter values for which first output clock jitter is lowest, as a second priority, and
identify parameter values for which the frequency difference between the first output clock and the desired frequency is lowest, as a third priority.

14. The system of claim 12, wherein:
the first circuit portion is configured to output a second interim clock; and
the second circuit portion is controllable to generate the first output clock from a selected one of the first and second interim clocks.

15. The system of claim 12, wherein:
the input reference clock has one of multiple frequencies; and
the first circuit portion is controllable to generate the first interim clock at the substantially fixed frequency for each of the multiple frequencies of the input reference clock.

16. The system of claim 12, wherein:
the first PLL includes an inductive-capacitive voltage-controlled oscillator; and
the second PLL includes one or more of a self-biased voltage-controlled oscillator and a digitally-controlled oscillator.

17. The system of claim 12, wherein:
the second PLL includes a self-biased voltage-controlled oscillator (SB-VCO); and
the control portion includes a capacitive control portion to increase a capacitance exposed to self-bias circuitry of the SB-VCO when an operating frequency of the SB-VCO is at or below a threshold.

* * * * *